US010559503B2

(12) United States Patent
Bouche et al.

(10) Patent No.: US 10,559,503 B2
(45) Date of Patent: Feb. 11, 2020

(54) METHODS, APPARATUS AND SYSTEM FOR A PASSTHROUGH-BASED ARCHITECTURE

(71) Applicant: GLOBALFOUNDRIES INC., Grand Cayman (KY)

(72) Inventors: Guillaume Bouche, Albany, NY (US); Tuhin Guha Neogi, Fishkill, NY (US); Andy Chi-Hung Wei, Queensbury, NY (US); Jia Zeng, Sunnyvale, CA (US); Jongwook Kye, Sunnyvale, CA (US); Jason Eugene Stephens, Menands, NY (US); Irene Yuh-Ling Lin, Los Altos, CA (US); Sudharshanan Raghunathan, Mechanicville, NY (US); Lei Yuan, Cupertino, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/728,445

(22) Filed: Oct. 9, 2017

(65) Prior Publication Data

US 2018/0033701 A1    Feb. 1, 2018

Related U.S. Application Data

(62) Division of application No. 15/067,953, filed on Mar. 11, 2016, now Pat. No. 9,818,651.

(51) Int. Cl.
*H01L 21/00* (2006.01)
*H01L 21/8238* (2006.01)
(Continued)

(52) U.S. Cl.
CPC .. *H01L 21/823871* (2013.01); *G06F 17/5068* (2013.01); *G06F 17/5072* (2013.01); *H01L 21/027* (2013.01); *H01L 21/76895* (2013.01); *H01L 21/823431* (2013.01); *H01L 21/823475* (2013.01); *H01L 21/823821* (2013.01); *H01L 27/0924* (2013.01); *H01L 27/0886* (2013.01)

(58) Field of Classification Search
CPC ....... H01L 21/823871; H01L 21/76895; G06F 17/5072
See application file for complete search history.

(56) References Cited

U.S. PATENT DOCUMENTS 8,716,081 B2 *   5/2014   Teo ................... H01L 27/10805
                                                                438/197
8,975,712 B2 *   3/2015   Rashed ................. H01L 21/845
                                                                257/401

(Continued)

OTHER PUBLICATIONS

Office Action dated Feb. 27, 2017 from parent U.S. Appl. No. 15/067,953, now issued as U.S. Pat. No. 9,818,651.

*Primary Examiner* — Laura M Menz
(74) *Attorney, Agent, or Firm* — Williams Morgan, P.C.

(57) ABSTRACT

At least one method, apparatus and system disclosed herein for forming a finFET device having a pass-through structure. A first gate structure and a second gate structure are formed on a semiconductor wafer. A first active area is formed on one end of the first and second gate structures. A second active area is formed on the other end of the first and second gate structures. A trench silicide (TS) structure self-aligned to the first and second gate structures is formed. The TS structure is configured to operatively couple the first active area to the second active area.

9 Claims, 7 Drawing Sheets

(51) Int. Cl.
*H01L 21/8234* (2006.01)
*H01L 21/027* (2006.01)
*H01L 27/092* (2006.01)
*G06F 17/50* (2006.01)
*H01L 21/768* (2006.01)
*H01L 27/088* (2006.01)

(56) References Cited

U.S. PATENT DOCUMENTS

| | | | | |
|---|---|---|---|---|
| 9,379,209 | B2* | 6/2016 | Cai | H01L 29/4958 |
| 9,412,660 | B1* | 8/2016 | Xie | H01L 21/76897 |
| 9,437,588 | B1* | 9/2016 | Zeng | H01L 27/0207 |
| 9,816,581 | B2* | 11/2017 | Ueki | F16F 13/107 |
| 9,818,651 | B2* | 11/2017 | Bouche | H01L 21/823871 |
| 9,899,321 | B1* | 2/2018 | Park | H01L 29/41775 |
| 10,236,350 | B2* | 3/2019 | Bouche | H01L 29/401 |
| 10,438,850 | B1* | 10/2019 | Cheng | H01L 27/092 |
| 2014/0339647 | A1* | 11/2014 | Rashed | H01L 21/845 257/401 |
| 2015/0060960 | A1* | 3/2015 | Xie | H01L 29/785 257/288 |
| 2015/0108583 | A1* | 4/2015 | Rashed | H01L 21/845 257/401 |
| 2015/0270176 | A1* | 9/2015 | Xie | H01L 21/76885 257/384 |
| 2015/0340457 | A1* | 11/2015 | Xie | H01L 29/66545 257/288 |
| 2015/0364378 | A1* | 12/2015 | Xie | H01L 21/823437 257/368 |
| 2016/0133623 | A1* | 5/2016 | Xie | H01L 27/088 257/384 |
| 2016/0163644 | A1* | 6/2016 | Woo | H01L 27/0924 257/401 |
| 2016/0284799 | A1* | 9/2016 | Yoon | H01L 29/0653 |
| 2016/0300766 | A1* | 10/2016 | Kim | H01L 21/823475 |
| 2016/0300840 | A1* | 10/2016 | Seo | H01L 21/823871 |
| 2016/0358908 | A1* | 12/2016 | Xie | H01L 27/088 |
| 2016/0359009 | A1* | 12/2016 | Xie | H01L 29/4232 |
| 2017/0263715 | A1* | 9/2017 | Bouche | H01L 29/401 |
| 2018/0033701 | A1* | 2/2018 | Bouche | H01L 21/823871 |
| 2018/0315822 | A1* | 11/2018 | Xie | H01L 29/41775 |

* cited by examiner

METHODS, APPARATUS AND SYSTEM FOR A PASSTHROUGH-BASED ARCHITECTURE

BACKGROUND OF RELATED APPLICATIONS

This application is a divisional of co-pending U.S. patent application Ser. No. 15/067,953, filed Mar. 11, 2016.

BACKGROUND OF THE INVENTION

Field of the Invention

Generally, the present disclosure relates to the manufacture of sophisticated semiconductor devices, and, more specifically, to providing a pass-through based architecture.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative FinFET device, which is a 3-dimensional structure. More specifically, in a FinFET, a generally vertically positioned, fin-shaped active area is formed and a gate electrode encloses both of the sides and the upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure.

FinFET designs use "fins" that may be formed on the surface of a semiconductor wafer using selective-etching processes. The fins may be used to form a raised channel between the gate and the source and drain of a transistor. The gate is then deposited such that it wraps around the fin to form a trigate structure. Since the channel is extremely thin, the gate would generally have a greater control over the carriers within. However, when the transistor is switched on, the shape of the channel may limit the current flow. Therefore, multiple fins may be used in parallel to provide greater current flow for increased drive strength.

FIG. 1 illustrates a stylized cross-sectional depiction of a state-of-the-art FinFET device. A FinFET device 100 illustrated in FIG. 1 comprises a plurality of "fins" 110. The semiconductor device may be position to a vertical orientation, creating one or more fins 110. The source and drain of the FinFET are placed horizontally along the fin. A high-k metal gate 120 wraps over the fin, covering it on three sides. The gate 120 defines the length (labeled L) of the FinFET device. The current flow occurs along an orthogonal crystal plane in a direction parallel to the plane of the semiconductor wafer. The electrically significant height of the fin (labeled H) is typically determined by the amount of oxide recess in the fin reveal step and hence is constant for all fins 110.

The thickness of the fin (labeled TO determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a better packing of the devices per square area resulting in a denser design, or more efficient use of silicon wafer area.

The scaling down of integrated circuits coupled with higher performance requirements for these circuits have prompted an increased interest in finFETs. FinFETs generally have the increased channel widths, which includes channel portions formed on the sidewalls and top portions of the fins. Since drive currents of the finFETs are proportional to the channel widths, finFETs generally display increase drive current capabilities.

Designers are constantly attempting to increase the density of integrated circuits by decreasing the size of features on semiconductor devices. As a result, there is challenge to create standard functional cell library logic devices, such as scan-D flip-flops and multiplexers to accommodate the smaller devices. This is particularly the case at the 10 nm node, where lithographic limitations can result in a lack of scaling of standard cell library devices. One solution attempted by designers is to perform cross coupling of transistors for providing standard cell library devices. Cross coupling and logic scaling provides for utilizing lower amount of area of the semiconductor device, in an attempt to overcome undesirable properties, such as larger semiconductor device or less functionality in the semiconductor device.

As finFET devices become more dense (e.g., 10 nm technology), the tracks (i.e., metal pitch) become smaller. This raises many issues, such as processing accurately at 7.5 nm track (7.5 T) spaces. In a 7.5 T design, in a standard cell, at 42 nm spacing per track, only 315 nm are generally available. Generally 42 nm is typically selected as a limit to allow for printing Self-Aligned Double Patterns (SADP) at various sizes, as would be required for Static Random Access Memory (SRAM) Metal 2 (M2) Word Lines (WL) and potential sizing usage in logic routing levels.

Designers often use pre-designed basic cells to form layouts of more complex cells comprising finFET devices (e.g., flip-flops). In a CMOS integrated circuit, PMOS and NMOS transistor pairing are often used to form circuit cells. For example, FIG. 2 illustrates a stylized cross-sectional depiction of a state-of-the-art cell design. The PMOS region 201 of the cell 200 comprises a plurality of PMOS full stripe source/drain (S/D) contacts 210. The NMOS region 202 comprises a plurality of NMOS full stripe S/D contacts 212. Further, the cell 200 comprises a plurality of gates 230.

In order to tie some features of the cell 200, e.g., gates, to power signals ($V_{DD}$ and $V_{SS}$), power rails may be formed. Generally, the source or the drain contacts are also connected to power signals using the power rails. In the example of FIG. 2, a PMOS source contact 232 is connected to $V_{DD}$ power rail through a CA via connection. Similarly, an NMOS source contact 252 is connected to $V_{SS}$ using the power rail 265 through a CA via connection.

Often, a circuit design may call for connecting a portion of the S/D regions 270 of the PMOS region 201 to the S/D regions 270 of the NMOS region 202. As shown in FIG. 2, a cell 200 comprises a plurality of C-shaped M1 structures (240a, 240b, 240c, collectively "240"). The C-shaped structures 240 are used to provide a connection between a portion of the PMOS region 201 (e.g., S/D fins 270) and a portion of the NMOS region 202 (e.g., S/D fins 265). As described below, the C-shaped structures 240 may cause various problems. A more simplified description of the C-shaped structures 240 is provided in FIG. 3 below.

FIG. 3 illustrates a stylized depiction of a typical C-shaped structure in a cell 300. The cell 300 comprises a plurality of PC (gate) formations 310. A plurality of CB metal formations 350 may be used to connect up some gates 310 to formations in other/upper metal layer. The cell 300 includes a $1^{st}$ active region 320 (e.g., NMOS region) and a $2^{nd}$ active region 330 (e.g., PMOS region. The cell 300 may also comprise a $1^{st}$ CA formation 360 and a $2^{nd}$ CA formation 365. The $1^{st}$ CA formation 360 may be connected to the active region 320 using a via 361, and the $2^{nd}$ CA formation 365 may be connected to the active region 330 using a via 366. The $1^{st}$ CA formation 360 from the NMOS region may be connected to the $2^{nd}$ CA formation 365 by using a C-shaped M1 formation, wherein the C-shape is used to route around the CB formations 350.

In some cases, there may be instances where for routing around certain structures, a C-shape structure 240b may be formed. In some cases, other routing issues may prompt a designer to place another, larger C-shape structure 240a, which may envelop the C-shape structure 240b (as shown in FIG. 2). In this case, unidirectional metal structures (M0/M1) may be used to accommodate routing around these nested C-shape structures 240. However, this approach is often problematic because of via enclosures and metal line (M0) tip-to-tip limits.

The C-shaped structures 240 may cause various process issues. For example, usage of the C-shaped structures 240 requires more space, and thus, causes the cell 200 to become taller. This causes the integrated circuit formed using the cell 300 to be larger, and increases power consumption. Further, formation of the C-shaped structures 240 can cause lateral connection problems. Also, more silicon would be required at the corners of the C-shaped structures 240, which could cause process errors. Further, the C-shaped structures 240 cause various routing congestion problems.

Designers have attempted to alleviate some of the problems with C-shaped structures 240 by reducing the number of C-shaped structures 240 being used by providing a CA pass-through formation 440, which passes through the cell from the PMOS active region 330 to the NMOS region 320. FIG. 4 illustrates a stylized depiction of a cell 400 that includes a CA pass-through formation. The CA formation 440 is formed between gates 310. The CA formation 440 is generally formed using self-aligned contact (SAC) formation process. As such, the CA formation 440 tends to be upsized.

As a result of the size of the CA pass-through 440, the CB formations have to be offset. The CB formations 450 of the cell 400 are offset on the gates 310. However, process variations may cause the CB formation 450 to overlap onto the CA formation 440, thereby causing errors, such as shorts. As such, the industry lacks an efficient solution to the problem of congestion and errors caused by C-type formation in integrated circuits formed from processing of semiconductor wafers.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for forming a finFET device having a pass-through structure. A first gate structure and a second gate structure are formed on a semiconductor wafer. A first active area is formed on one end of the first and second gate structures. A second active area is formed on the other end of the first and second gate structures. A trench silicide (TS) structure self-aligned to the first and second gate structures is formed. The TS structure is configured to operatively couple the first active area to the second active area.

BRIEF DESCRIPTION OF THE DRAWINGS

The disclosure may be understood by reference to the following description taken in conjunction with the accompanying drawings, in which like reference numerals identify like elements, and in which.

Figure 1:
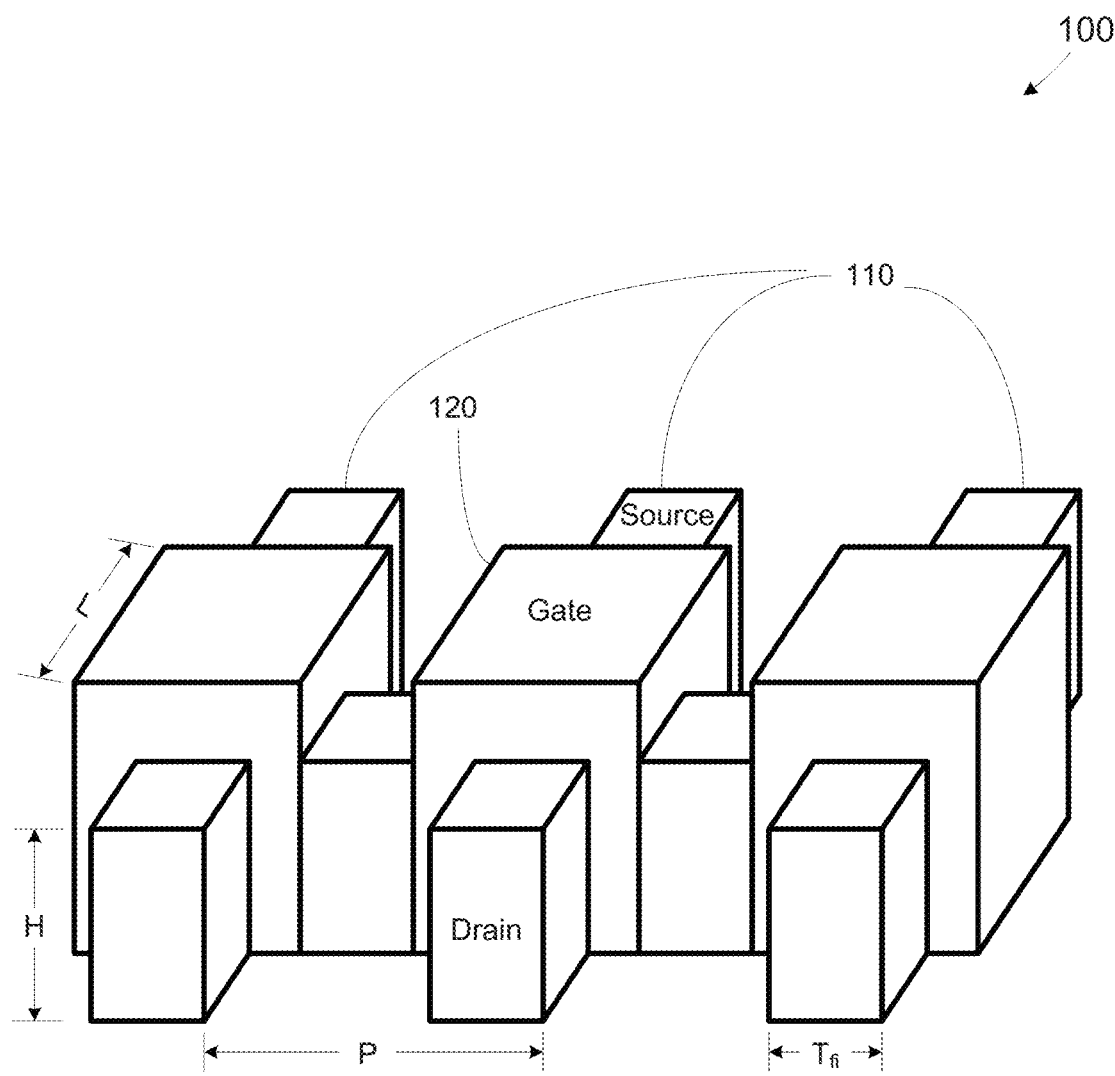
FIG. 1 illustrates a stylized cross-sectional depiction of a state-of-the-art FinFET device.
Figure 2:
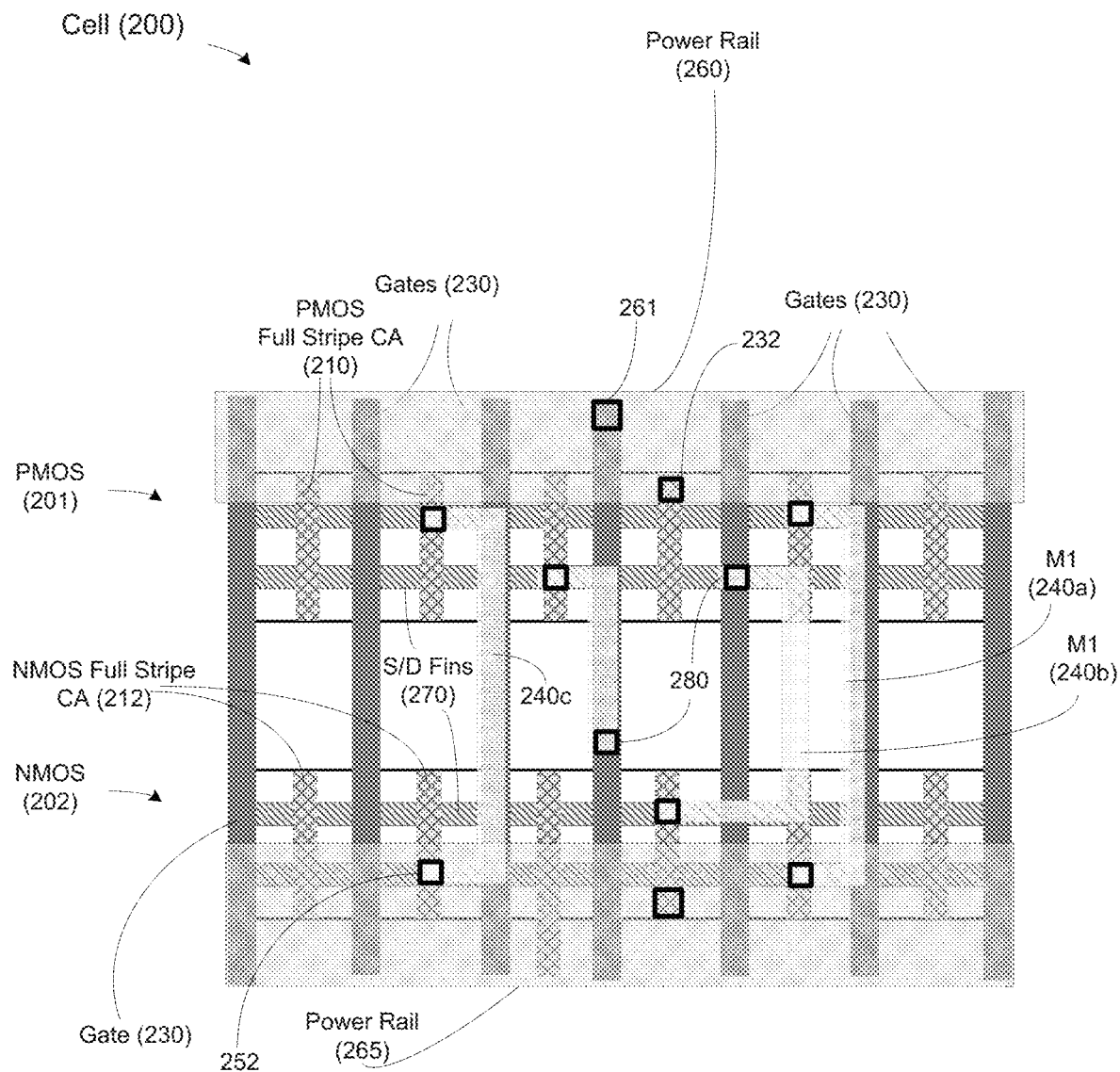
FIG. 2 illustrates a stylized cross-sectional depiction of a state-of-the-art cell design.
Figure 3:
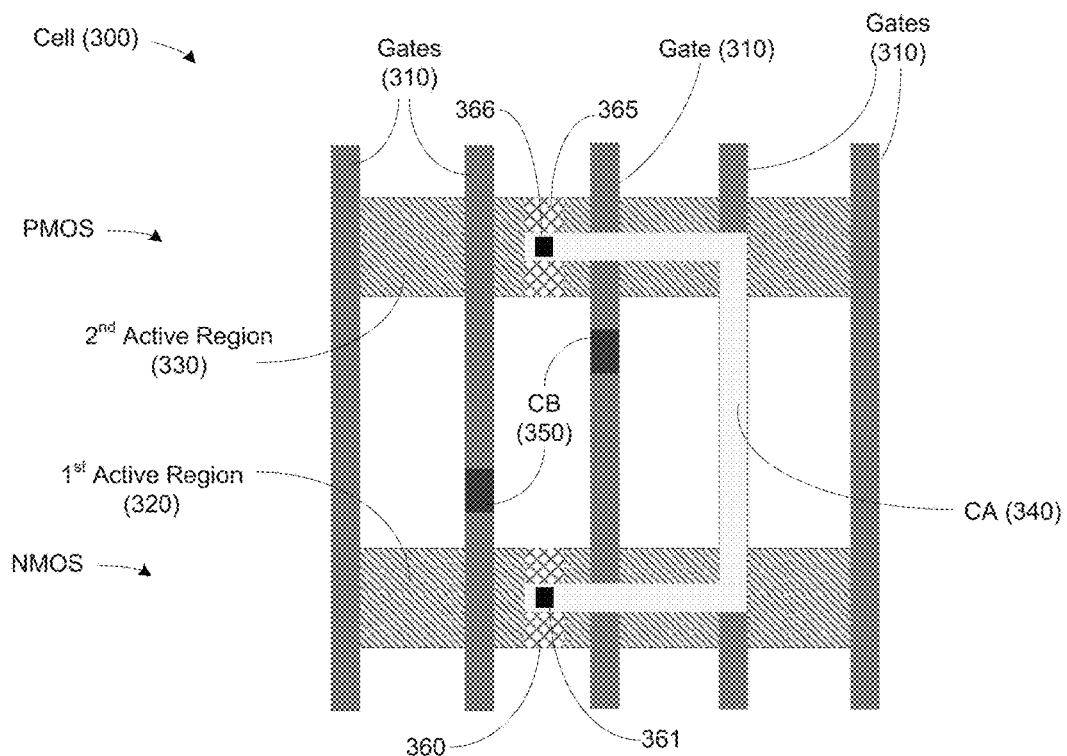
FIG. 3 illustrates a stylized depiction of a typical C-shaped structure in a functional cell.
Figure 4:
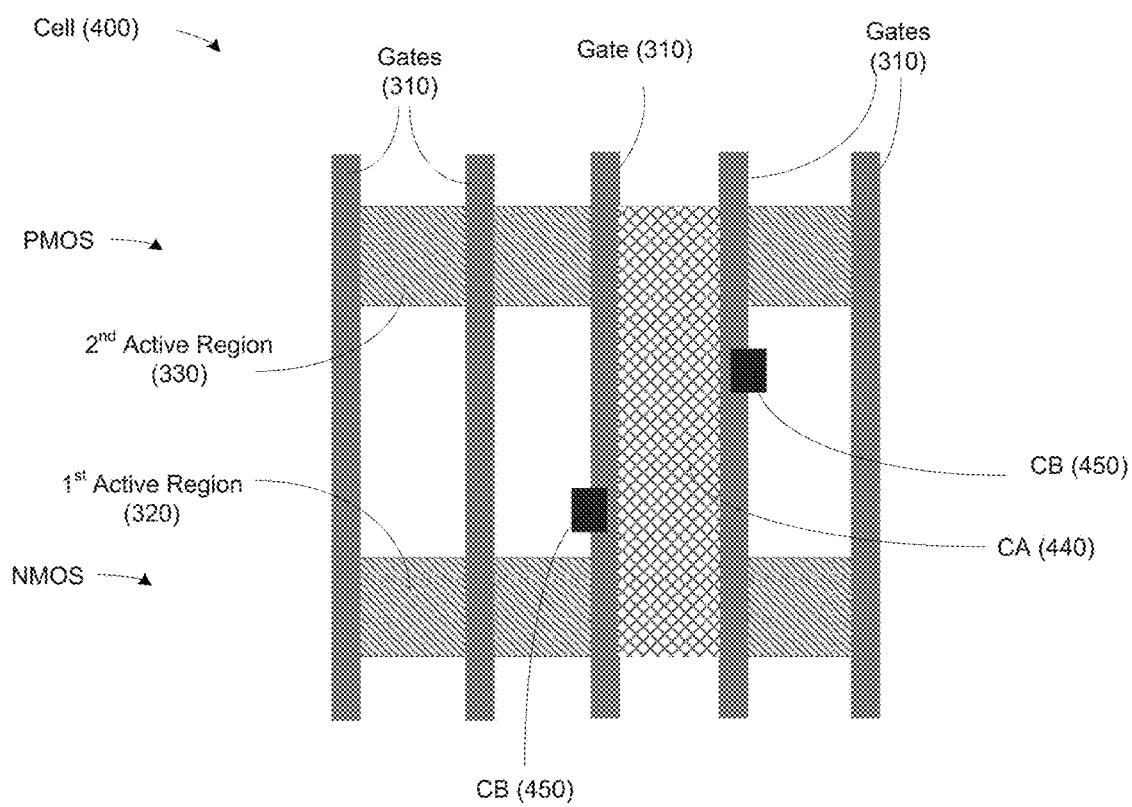
FIG. 4 illustrates a stylized depiction of a cell that includes a CA pass-through formation.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figs. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for utilizing a self-aligned trench-silicide (TS) pass-through structure to provide for interconnections with an integrated circuit formed from processing semiconductor wafers. Embodiments herein provide for a borderless TS pass-through architecture to reduce the usage for some metal interconnection structures, such as C-shaped metal connection lines. Embodiments herein provide for forming CB formations as a self-aligned via to form CB connections in a offset fashion to provide sufficient connection with PC (gate) formations while maintaining sufficient clearance form TS pass-through formations.

Embodiments herein provide for a 10 nm architecture that is capable of providing 31.5 nm fin pitch in a 7.5 nm track design at 42 nm metal (Mx, wherein x=0, 1, 2, 3, . . . ) pitch for processing cross couple. Embodiments herein provide for a self-aligned to gate borderless TS, as well as a self-aligned to gate local interconnect structure (i.e., CA structure) connecting the top of TS. In embodiments herein, another local interconnect structure (i.e., CB structure) connecting top of gate may be self-aligned within the metal line above (M0) in a dual damascene scheme. The design provided by embodiments herein provides for obviating the need for V0 (via) because the M0 of embodiments herein is designed to land directly on CA/CB. Further, M0 may be unidirectional, wherein the M1 of previous designs is replaced by the M0. Further, the M2 of previous designs may be replaced by M1. Embodiments herein provide for a six mask middle of line (MOL) process, wherein the first level metal is not needed to finish a standard cell. That is, the first level metal M1 may be used as the routing level.

Although not limited to specific embodiments disclosed in the present disclosure, exemplary embodiments herein provide for processing a semiconductor wafer for forming a device comprising a plurality of fins having 31.5 nm in a horizontal configuration in a 10 nm architecture. Further, the device may comprise vertical PC gate with contacted poly pitch (CPP) of 63 nm processed using a succession of four litho and etch steps (LELE) processing. The vertical M0 metal structure may be of 42 nm LELE with LELE CB vias and tabs on active structures.

The device of embodiments herein may also comprise horizontal CA structures formed using LELE processing, wherein the CA structures may be in the form of bars and/or vias. The M1 metal lines of the structures may be horizontally formed using 42 nm self-aligning double pattering (SADP) processing utilizing two blocks or cut masks. The M2 metal lines of the device may be vertically formed using 42 nm SADP processing utilizing one cut mask. The M3 metal lines of the device may be horizontally formed using 42 nm SADP processing utilizing one cut mask. In one embodiment, 42 nm measurement is selected as a limit to allow for printing SADP at various sizes required for form SRAM M2 WL lines. Further, the 42 nm measurement may be utilized for potential sizing usage in logic routing levels.

Figure 5:
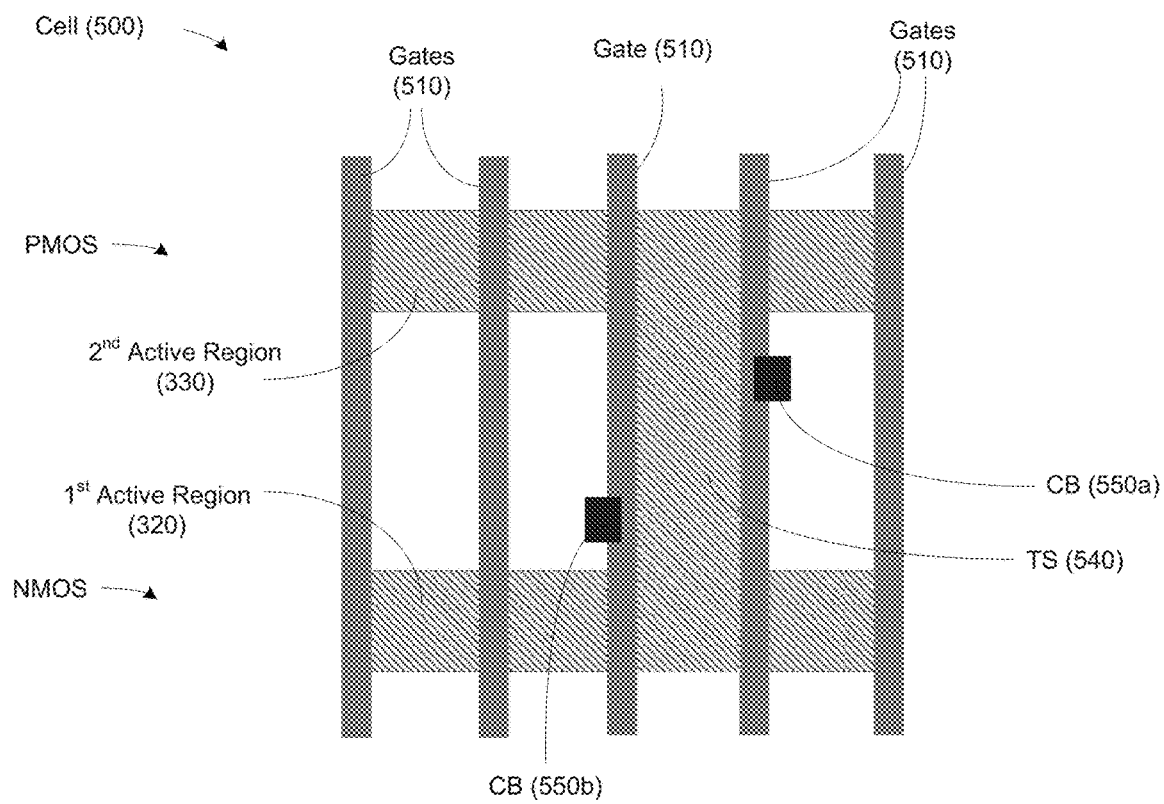
FIG. 5 illustrates a stylized depiction of a cell, in accordance with embodiments herein.

Turning now to FIG. 5, a stylized depiction of a cell 500, in accordance with embodiments herein, is illustrated. The cell 500 comprises five PC (gates 510), two of which are contacted by CB.

The cell 500 comprises a $1^{st}$ active region 320 and a $2^{nd}$ active region 330. In this embodiment, instead of a CA pass-through feature, a TS pass-through feature 540 is used to connect a portion of the $1^{st}$ active region 320 to a portion of the and $2^{nd}$ active region 330. This reduces the need for using an C-shaped M1 feature to connect the active regions 320, 330. In some embodiments, the TS feature 540 is a self aligned contact (SAC) feature. The TS feature 540 may be self-aligned to the gates 510. Two CB features 550a and 550B may be formed on the gates 510 in an offset manner as to not overlap into the SAC area of the TS features 540.

Generally, the TS feature 540 is self-aligned and when seen in cross section flush with the height of the gate structures 510. The offset CB features 550 are formed above the gate structures 510, but offset away from the TS features 540. In contrast, an SAC CA feature formed between the gates structure 510 would not be contained between the gates 510 and would not be flush with the gate height. This could lead to process error, e.g., shorts to CB structures.

The borderless TS structure 540 provides for connecting a portion of the $1^{st}$ active region 320 to a portion of the $2^{nd}$ active region 330 of the cell 500, while reducing process errors and shorts to CB formations that are formed on the gates 510. The term borderless in one embodiment, may refer to a lithography stack that was overlapping the gates 510, but ultimately processing makes the TS structure 550 self-aligned to the gates 510, wherein the TS structure 550 is flush in height with the gates 510 and sides of TS are bordered by the adjacent gate spacer or gate cap.

Figure 6:
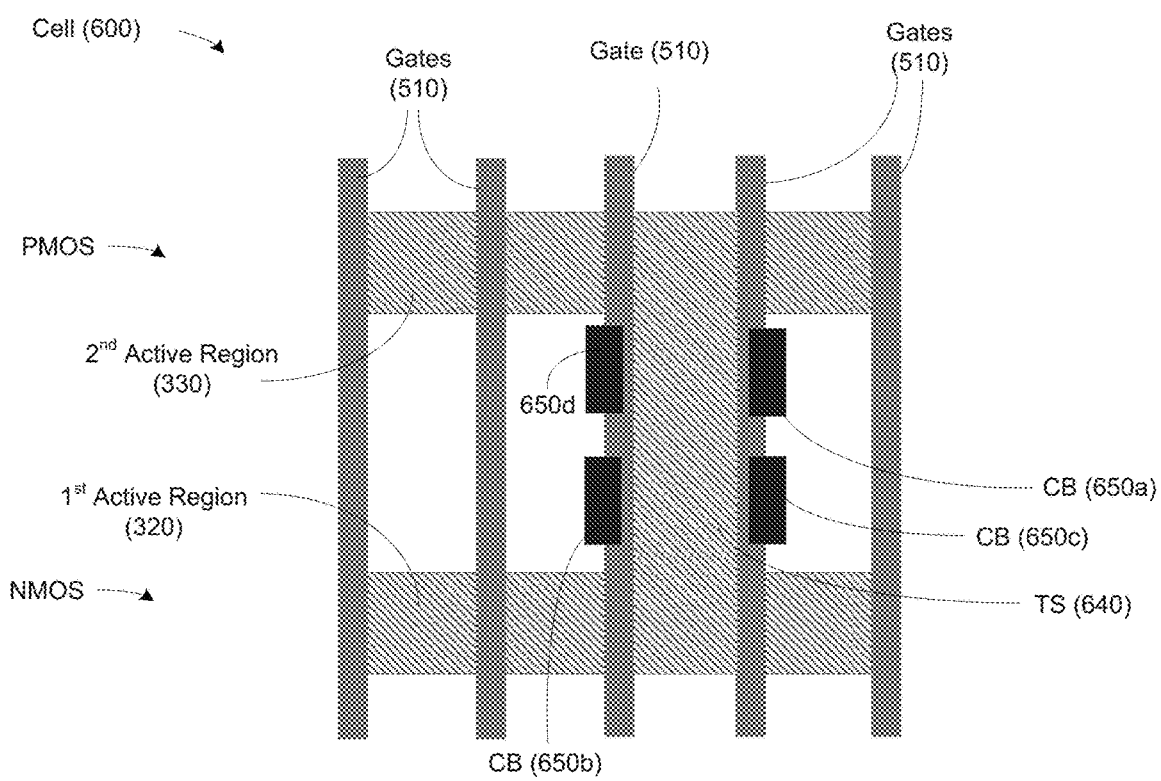
FIG. 6 illustrates a stylized depiction of a cell, in accordance with an alternative embodiment herein.

Turning now to FIG. 6, a stylized depiction of a cell 600, in accordance with an alternative embodiment herein, is illustrated. Similar to the cell 500 of FIG. 5, the cell 600 of FIG. 6 also comprises five PC (gates 510), two of which are adjacent and contacted by CB.

The cell 600 also comprises a $1^{st}$ active region 320 and a $2^{nd}$ active region 330. The cell 600 comprises a self-aligned TS pass-through feature 640 to connect a portion of the $1^{st}$ and $2^{nd}$ active regions 320, 330. The TS feature 640 may be self-aligned to the gates 510. In the cell 600, four CB features 650a, 650b, 650c, 650d are formed on the gates 510 in an offset manner such that they do not overlap into the SAC area of the TS features 640.

The CB features 650a, 650b, 650c, 650d may be formed in a thinner manner as to not inadvertently short onto unrelated, adjacent gates 510. However, in some cases, the offset, thinner CB features may not provide sufficient contact to the gates on which they are formed, particularly if process tolerances cause an increase in the offsets. Therefore, the CB features 650a, 650b, 650c, 650d may be formed in a taller manner to ensure sufficient contact with the gates 510 on which they are respectively formed. Note that in this case (layout view, top-down), thinner or taller relate to the CB length along the vertical (main) direction of the drawn gates.

However, in some cases, designers may prefer larger areas for routing purposes. In some embodiments, the CB features 650a, 650b, 650c, 650d may cause some congestion that may impede routing or placing of other CB and/or TS structures. This issue is addressed by confining the CB features 650a, 650b, 650c, 650d to be less tall, as exemplified below in FIG. 7.

Figure 7:
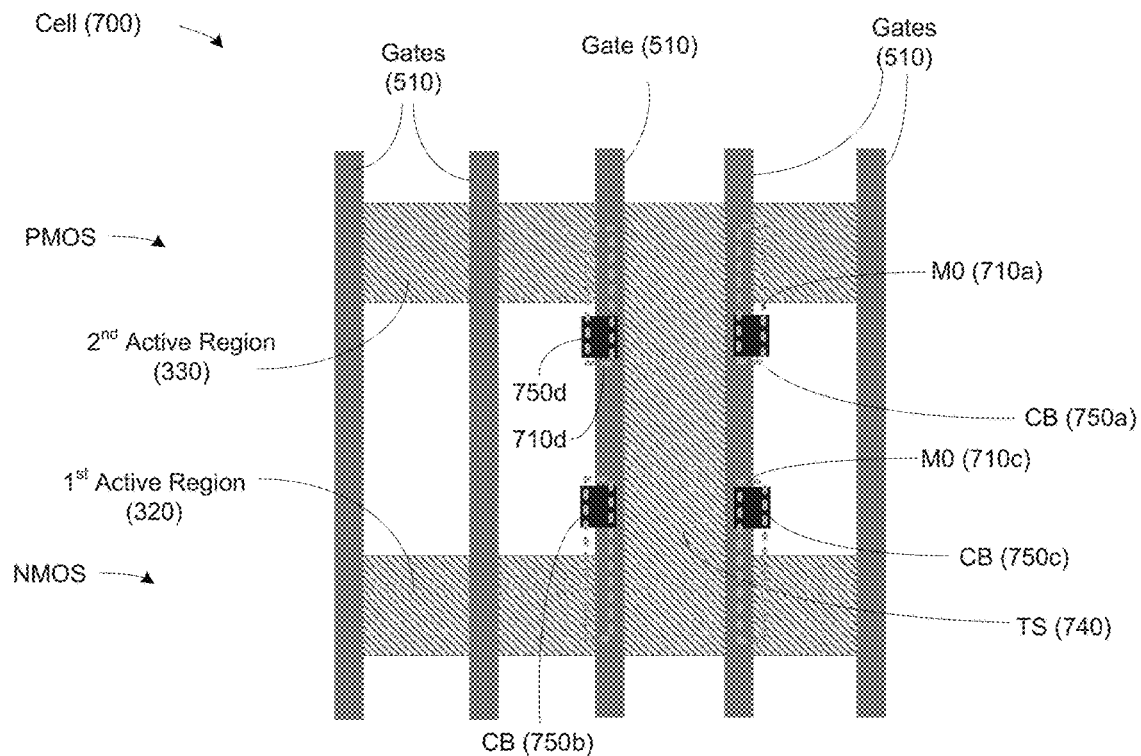
FIG. 7 illustrates a stylized depiction of a cell having confined CB structures, in accordance with an embodiments herein.

Turning now to FIG. 7, a stylized depiction of a cell 700 having confined CB structures, in accordance with embodiments herein, is illustrated. The cell 700 also comprises a $1^{st}$ active region 320 and a $2^{nd}$ active region 330. The cell 700 comprises a self-aligned TS pass-through feature 740 to connect a portion of the $1^{st}$ and $2^{nd}$ active regions 320, 330. The TS feature 740 may be self-aligned to the gates 510.

In the cell 700, four CB features 750a, 750b, 750c, 750d are formed on the gates 510 in an offset manner as to not overlap into the SAC area of the TS features 740. Further, the CB features 750a, 750b, 750c, 750d are formed as self-aligned vias (SAVs). The formation of the CB features 750a, 750b, 750c, 750d are confined/defined by the metal formation M0 due to the fact that the CB features 750a, 750b, 750c, 750d are self-aligned to the M0 borders by a dual damascene process.

The CB feature 750a is formed in a self-aligned manner with respect to an M0 formation 710a. Similarly, the CB feature 750b is formed in a self-aligned with respect to an M0 formation 710b, CB feature 750c with respect to an M0 formation 710c, and CB feature 750d with respect to an M0 formation 710d. That is, the SAV CB features 750a, 750b, 750c, 750d are formed only at the intersection of CB and M0 structures. Therefore, the margin of error with respect to the shapes of the CB features 750a, 750b, 750c, 750d are reduced.

Forming the CB features 750a, 750b, 750c, 750d as self-aligned vias respectively through the M0 features 710a, 710b, 710c, 710d provides for smaller, more confined CB features 750a, 750b, 750c, 750d that land offset on the gates 510 for providing clearance to the borderless TS pass-through feature 740. This process may also lead to a vertical-horizontal-vertical-horizontal (VHVH) architecture. In one embodiment, the VHVH architecture refers to alternating vertical and horizontal metal lines, e.g., an architecture that comprises vertical M0 features, horizontal M1 features, vertical M2 features, etc.

Figure 8:
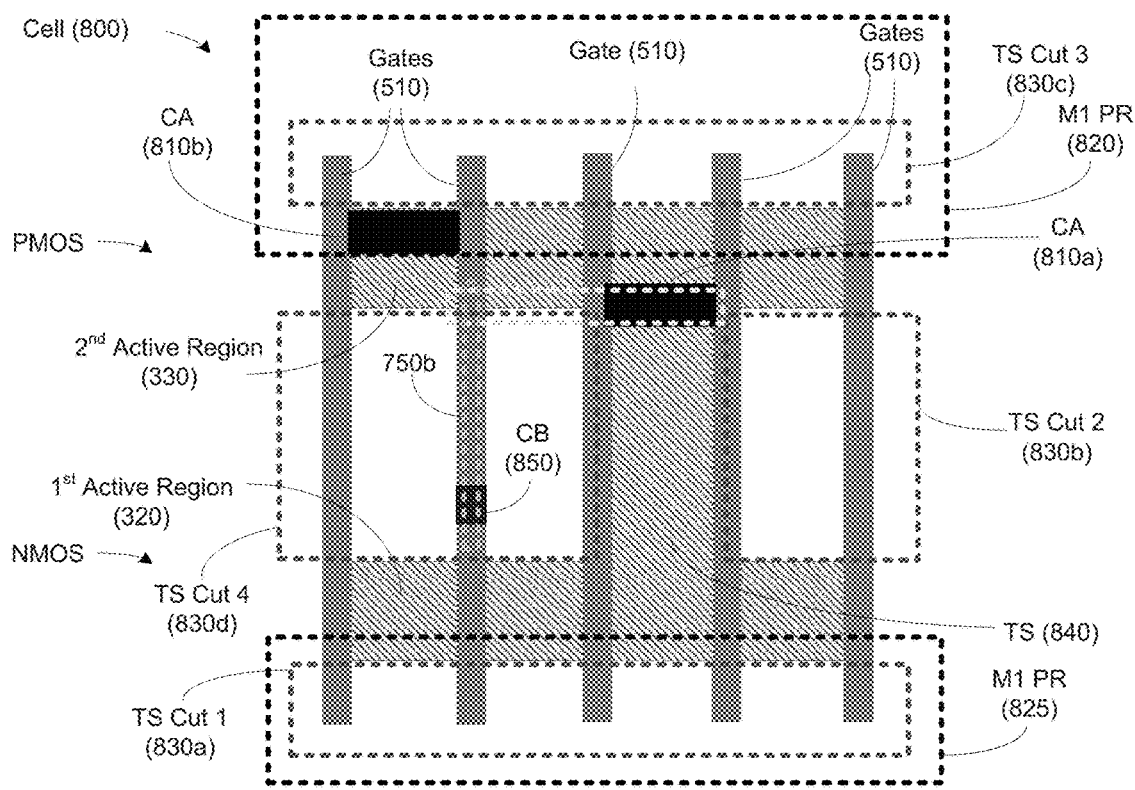
FIG. 8 illustrates a stylized depiction of a cell having a TS and an M1 power rail, in accordance with an embodiments herein.

Turning now to FIG. 8, a stylized depiction of a cell 800 having a TS and an M1 power rail, in accordance with an embodiments herein, is illustrated. The cell 700 also comprises a $1^{st}$ active region 320 and a $2^{nd}$ active region 330. The cell 800 comprises a self-aligned TS pass-through feature 840 to connect a portion of the $1^{st}$ and $2^{nd}$ active regions 320, 330. The TS feature 840 may be self-aligned to the gates 510.

FIG. 8 also illustrates an M1 power rail 820 (e.g., $V_{SS}$) in a VHVH architecture is in a horizontal configuration. The cell 800 may also comprise a $V_{DD}$ power rail 825, also in a horizontal configuration. In one embodiment, the TS features may be expanded and TS ends can be placed within the power rails envelope. As such, the cell 800 also comprises plurality of TS cut masks (e.g., a $1^{st}$ TS cut mask 830a, a $2^{nd}$ TS cut mask 830b, a $3^{rd}$ TS cut mask 830c, and a $4^{th}$ TS cut mask 830d (collectively "830")).

The $1^{st}$ active area 320 a is formed between the $1^{st}$ TS cut mask 830a and the $2^{nd}$ and $4^{th}$ TS cut mask 830b, 830d. The $2^{nd}$ active area is formed between the $3^{rd}$ TS cut mask 830c and the $2^{nd}$ and $4^{th}$ TS cut mask 830b, 830d. The TS pass-through structure 840 is formed between the gates 510 at the borders of the $2^{nd}$ and $4^{th}$ TS cut mask 830b, 830d.

A CB feature 850 may be formed on one of the gates 510. Further, in some embodiments, CA plugs may be used to connect to metal layers, such as the M1 power rail 820. For example, the CA plug/feature 810b may be formed to connect to the M1 power rail 820. A CA feature 810a may be formed over the TS pass-through feature 840.

Designers may have more freedom for routing with respect to the CA features 810 as a result of the SAC cap on the gates 510. The M0 SAV edge is not required to form the CA, unlike the formation of the CB features described above. Therefore, in one embodiment, a process may comprise forming CB features using SAV through M0 feature-boundaries, with the CA features being independent of M0. In one embodiment, the TS features may be formed using only cut masks. As shown in FIG. 8, CA features as pass-through may be eliminated by using TS features as pass-through features, while using CA plugs to connect to a metal layer (e.g., M1 metal layer).

Although not limited to specific embodiments disclosed in the present disclosure, exemplary embodiments herein provide for processing a semiconductor wafer for forming a device comprising a plurality of fins having 31.5 nm pitch in a horizontal configuration in a 10 nm architecture. Further, the device may comprise gates with vertical contacted poly pitch (CPP) of 63 nm using LELE processing. The vertical M0 metal structure may be of 42 nm LELE with LELE CB vias and tabs on active structures.

The device of embodiments herein may also comprise horizontal CA structures formed using LELE processing, wherein the CA structures may be in the form of bars and/or vias. The M1 metal lines of the structures may be horizontally formed using 42 nm self-aligning double pattering (SADP) processing utilizing two blocks or cut masks. The M2 metal lines of the device may be vertically formed using 42 nm SADP processing utilizing one cut mask. The M3 metal lines of the device may be horizontally formed using 42 nm SADP processing utilizing one cut mask. In one embodiment, a 42 nm measurement is selected as a limit to allow for printing SADP at various sizes required for form SRAM M2 WL lines. Further, the 42 nm measurement may be utilized for potential sizing usage in logic routing levels.

Figure 9:
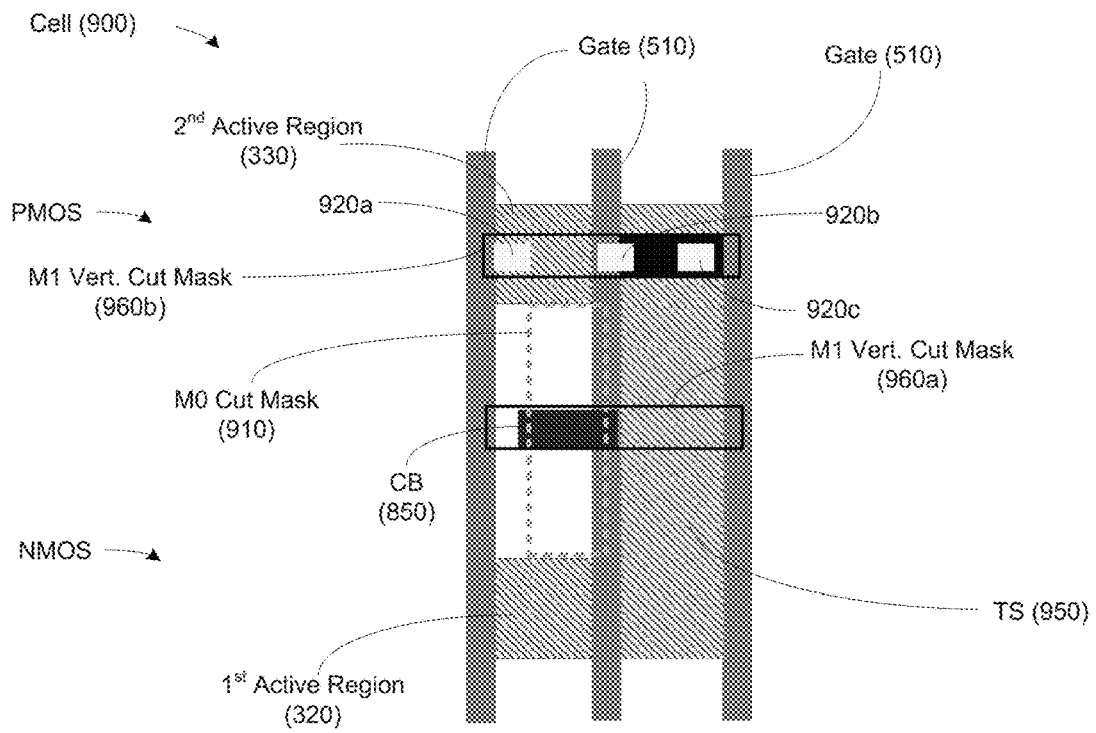
FIG. 9 illustrates a stylized depiction of a cell comprising two 42 nm metal pitch and 63 nm CPPs, in accordance with embodiments herein.

Turning now to FIG. 9, a stylized depiction of a cell 900 comprising two metal lines at 42 nm metal pitch and gates at 63 nm CPPs, in accordance with embodiments herein, is illustrated. The cell 900 comprises two CPPs that comprise three PC (gate) structures 510. The three PC structures 510, in one embodiment, may be on a 42 nm pitch, wherein 42 nm times three equals 126 nm. Two CPPs within 126 nm means that each CPP is about 63 nm.

The cell 900 also comprises a $1^{st}$ active region 320 and a $2^{nd}$ active region 330. The cell 900 comprises a self-aligned TS pass-through feature 950 to connect a portion of the $1^{st}$ and $2^{nd}$ active regions 320, 330. The TS feature 950 may be self-aligned to the gates 510.

A CB feature 850 is formed in a self-aligned manner with respect to an M0 formation 910. That is, the SAV CB feature 850 is formed only at the intersection of CB and M0 structures, and further defined by an M1 vertical cut mask 960a. Further, an M1 cut mask 960b may be a via enclosure for three pin access, wherein three vias 920a, 920b, 920c, may be formed within the M1 cut mask 960b. In some embodiment, the pins 920a, 920b may be formed based on asymmetric mirroring.

Figure 10:
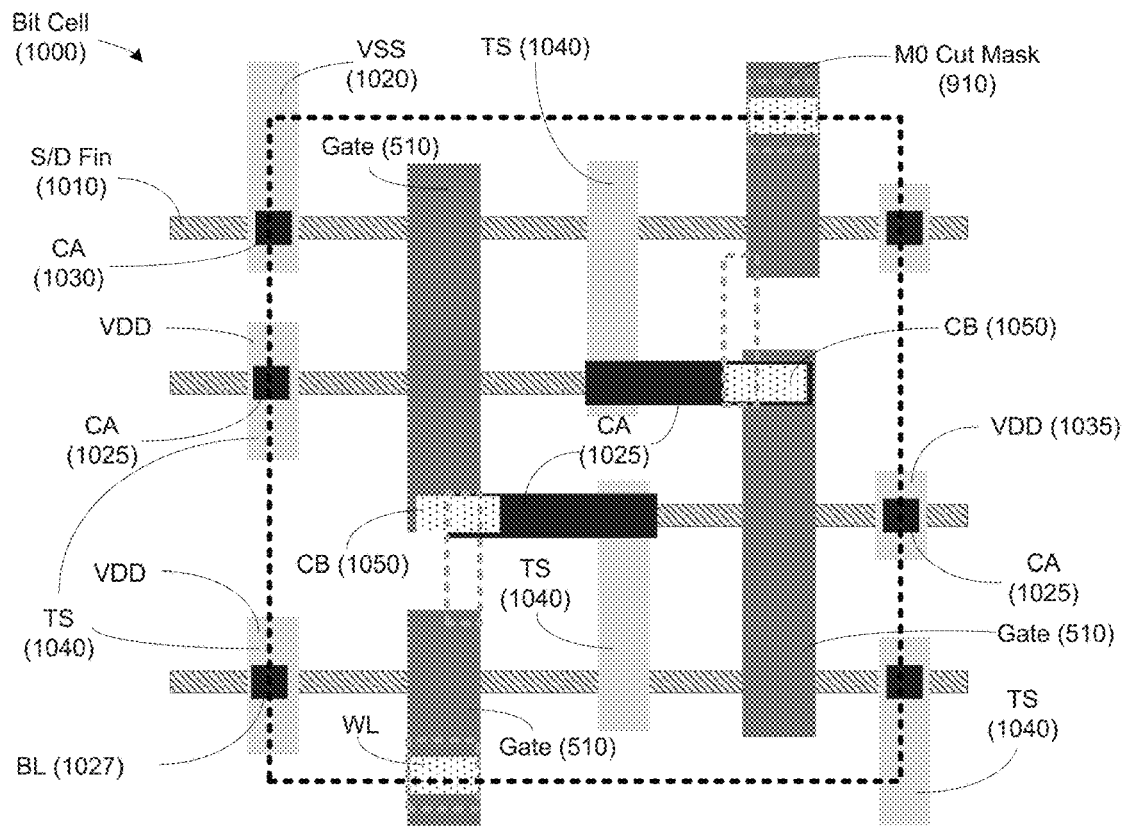
FIG. 10 illustrates a stylized depiction of an exemplary bit cell for a memory device, in accordance with embodiments herein.

Turning now to FIG. 10, stylized depiction of an exemplary bit cell for a memory device, in accordance with embodiments herein is illustrated. In one embodiment, a 111 bit cell 1000 may comprised of a plurality of fins 1010. The fins 1010 may be coupled to VSS 1020, VDD 1035, or to a bit line 1027 using CA structures 1030. The VDD formations 1030 may be coupled to the fins using a CA structures 1025.

A plurality of gate structures 510 may be formed. Further, a plurality of TS pass-through structures 1040 may also be formed. A plurality of CB structures 1050 may be formed offset from the gates 510, wherein some CB structures 1050 are self-aligned to M0 cut masks 910. A plurality of CA structures 1030 may be formed. The CA structures 1030 may be used to perform CA/CB stitching provided by embodiments herein connects to TS structures 1040, which in turn, connect to the gate 510. And M1 line may be used as a bit line, wherein an M2 line may be used as word lines.

Embodiments herein provide many advantages. For example, the gate T-shape cap described above provides extra-margin at CA patterning. This is because CA etch process may be an oxide etch process selective to nitride. If the CA structure is misaligned, the etching process for CA will not provide for a connection to the gate metal. If the SiOC spacer is exposed at bottom portion of the CA structure, a risk of short to gate is present.

Other advantages of embodiments herein include the fact that the TS is borderless, thus, gate to contact shorts are reduced, while area of contact is increased. Further the top of the TS structure would be flush with the top of the gate. Further, since CB is self-aligned into M0, the PC pickup using CB structures is possible. Also, since the top of CA and M0 are flush, they are ready for pick up simultaneously by M2/V0.

Further advantages include the fact that TS pass-through is possible, which reduces the usage of C-shape M1 structures. This may improve yields since C-shape structures can cause process errors due to corner rounding and difficulties in controlling etch biases.

Embodiments provide for the possibility of CA/CB stitch. This can be used for landing V0 or to short gate to Source/Drain. Further, gate tie constructs to power rail and ground rails are made easier through M0 or CA/CB stitch. Also, CA flyover with respect to multiple gates is possible since CA is not borderless and the gates have protection from thick nitride caps.

Other advantages of embodiments herein include the fact that the CB connector construct may be formed using either long bar CB structures or long bar M0 structures. Further, using embodiments herein, a one-CPP (contacted polysilicon pitch) cross couple design is possible. Further, a TS pass-through may be also implemented.

Figure 11:
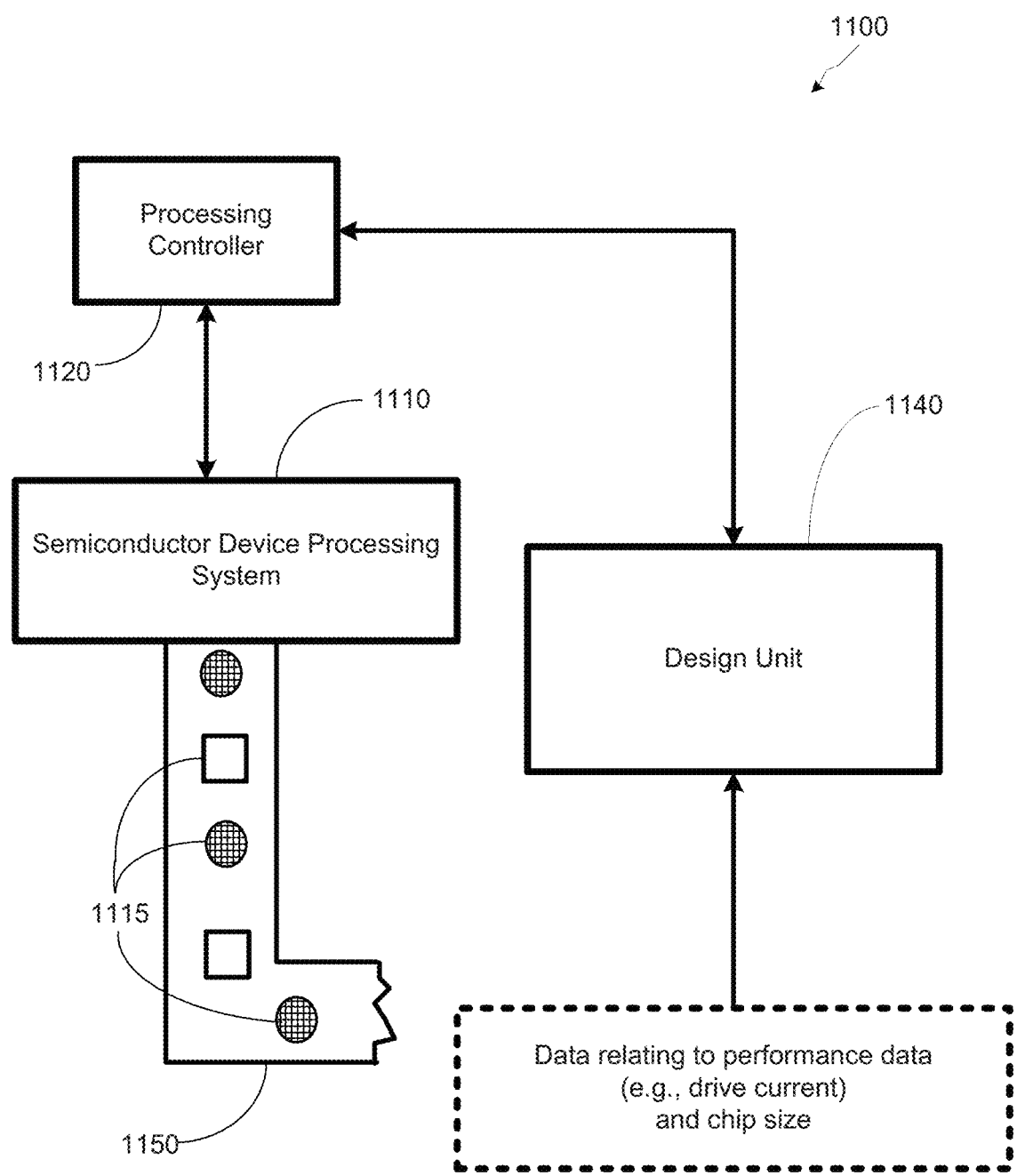
FIG. 11 illustrates a stylized depiction of a system for fabricating a semiconductor device package for forming finFET devices described herein, in accordance with embodiments herein.

Turning now to FIG. 11, a stylized depiction of a system for fabricating a semiconductor device package comprising cross couple design, in accordance with embodiments herein, is illustrated. The system 1100 of FIG. 11 may comprise a semiconductor device processing system 1110 and a design unit 1140. The semiconductor device processing system 1110 may manufacture integrated circuit devices based upon one or more designs provided by the design unit 1140.

The semiconductor device processing system 1110 may comprise various processing stations, such as etch process stations, photolithography process stations, CMP process stations, etc. One or more of the processing steps performed by the processing system 1110 may be controlled by the processing controller 1120. The processing controller 1120 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1110 may produce integrated circuits on a medium, such as silicon wafers. More particularly, the semiconductor device processing system 1110 produce integrated circuits having finFET devices that comprise gate fins that have a rounded head and/or a neck as described above.

The production of integrated circuits by the device processing system 1110 may be based upon the circuit designs provided by the integrated circuits design unit 1140. The processing system 1110 may provide processed integrated circuits/devices 1115 on a transport mechanism 1150, such as a conveyor system. In some embodiments, the conveyor system may be sophisticated clean room transport systems that are capable of transporting semiconductor wafers. In one embodiment, the semiconductor device processing system 1110 may comprise a plurality of processing steps, e.g., the $1^{st}$ process step, the $2^{nd}$ process set, etc., as described above.

In some embodiments, the items labeled "1115" may represent individual wafers, and in other embodiments, the items 1115 may represent a group of semiconductor wafers, e.g., a "lot" of semiconductor wafers. The integrated circuit or device 1115 may be a transistor, a capacitor, a resistor, a memory cell, a processor, and/or the like. In one embodiment, the device 1115 is a transistor and the dielectric layer is a gate insulation layer for the transistor.

The integrated circuit design unit 1140 of the system 1100 is capable of providing a circuit design that may be manufactured by the semiconductor processing system 1110. The integrated circuit design unit 1140 may receive various types of data including performance data, device specification, etc. Using such data, the design unit 1140 may provide various process definitions based on the data that includes performance data, device specification, etc. Based upon such details of the devices, the integrated circuit design unit 1140 may determine specifications of the finFETs that are to be manufactured using the processes described above. Based upon these specifications, the integrated circuit design unit 1140 may provide data for manufacturing a semiconductor device package described herein.

The system 1100 may be capable of performing analysis and manufacturing of various products involving various technologies. For example, the system 1100 may design and production data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A finFET device, comprising:
   a first gate structure and a second gate structure on a semiconductor substrate;
   a first active area contacting a first end of said first gate structure and contacting a first end of said second gate structure;
   a second active area contacting a second end of said first gate structure and contacting a second end of said second gate structure; and
   a self-aligned trench silicide (TS) structure configured to operatively couple said first active area to said second active area, wherein said TS structure is flush in height with said first gate structure and said second gate structure.

2. The finFET device of claim 1, wherein said self-aligned TS structure is a borderless pass-through structure that provides a pass-through route between said first and second active areas.

3. The finFET device of claim 1, further comprising a first local interconnect (CB) structure above at least one of said gate structures, wherein said CB structure is formed offset relative to said gate structure in a manner such that said CB structure does not contact the TS structure.

4. The finFET device of claim 3, wherein CB structure is a self-aligned via defined in one direction by the borders of an M0 metal formation.

5. The finFET device of claim 1, wherein said first active area, said second active area and said TS structure each are defined by at least one of a plurality of cut masks.

6. The finFET device of claim 1, further comprising a second local interconnect (CA) structure, wherein said CA structure is formed to make contact with said TS structure and said first active area.

7. The finFET device of claim 1, wherein said first active area is a PMOS region and wherein said second active area is an NMOS region.

8. The finFET device of claim 1, further comprising a first local interconnect (CB) structure above at least one of said gate structures, wherein said CB structure is formed offset relative to said gate structure in a manner such that said CB structure does not contact the TS structure; and
   a second local interconnect (CA) structure, wherein said CA structure is formed to make contact with said TS structure and said first active area;
   wherein a top of said CB structure and a top of said CA structure are coplanar.

9. The FinFET device of claim 8, further comprising a metallization formation (M0), wherein a top of said M0 formation is coplanar with said top of said CB structure and said top of said CA structure.

* * * * *